United States Patent [19]

Tokai et al.

[11] Patent Number: 5,016,561
[45] Date of Patent: May 21, 1991

[54] CONTINUOUS VACUUM PROCESSING APPARATUS

[75] Inventors: Masaie Tokai, Ryugasaki; Minoru Kuroiwa, Abiko; Shinobu Ezaki, Ibaraki, all of Japan

[73] Assignee: Hitachi, Ltd., Tokyo, Japan

[21] Appl. No.: 201,758

[22] Filed: Jun. 3, 1988

[30] Foreign Application Priority Data

Jun. 5, 1987 [JP] Japan ................... 62-139751
Jun. 5, 1987 [JP] Japan ................... 62-139754
Jun. 5, 1987 [JP] Japan ................... 62-139755

[51] Int. Cl.$^5$ ........................... C23C 14/56
[52] U.S. Cl. ........................ 118/718; 118/719; 118/733; 414/217; 242/190
[58] Field of Search ............ 414/217; 118/718, 719, 118/733; 242/190

[56] References Cited

U.S. PATENT DOCUMENTS

| 3,606,201 | 9/1971 | Petusky | 242/190 |
| 3,665,270 | 5/1972 | Ayers | 242/190 |
| 3,787,690 | 1/1974 | Neff | 242/190 |
| 3,829,038 | 8/1974 | Studer | 242/190 |
| 4,480,585 | 11/1984 | Gattuso | 118/733 |
| 4,492,181 | 1/1985 | Ovshinsky | 118/718 |
| 4,841,908 | 6/1989 | Jacobson | 118/733 |

Primary Examiner—Richard Bueker
Attorney, Agent, or Firm—Antonelli, Terry, Stout & Kraus

[57] ABSTRACT

A continuous vacuum processing apparatus including a slit-type sealing portion and a guide roller for guiding an object to be processed. The guide roller is provided at each of the two sides of the sealing portion or at one side thereof. Tension is applied to the object to be processed by another device provided between the guide rollers while the object is being conveyed, so as to enable it to be processed without being damaged.

4 Claims, 15 Drawing Sheets

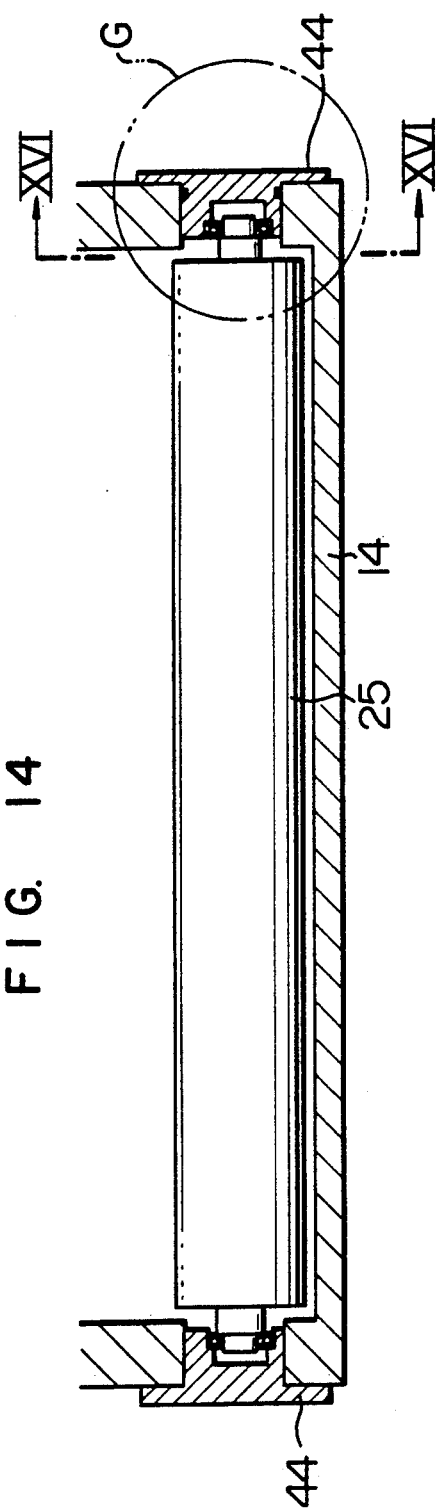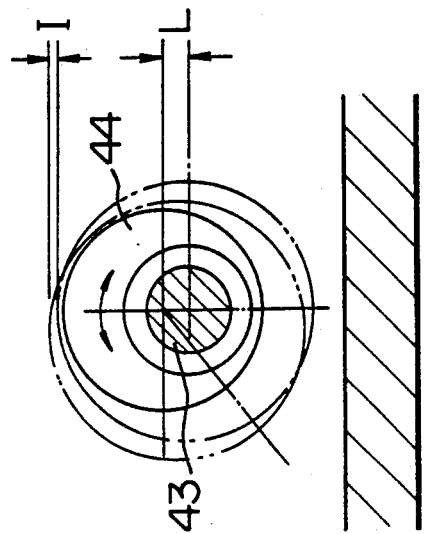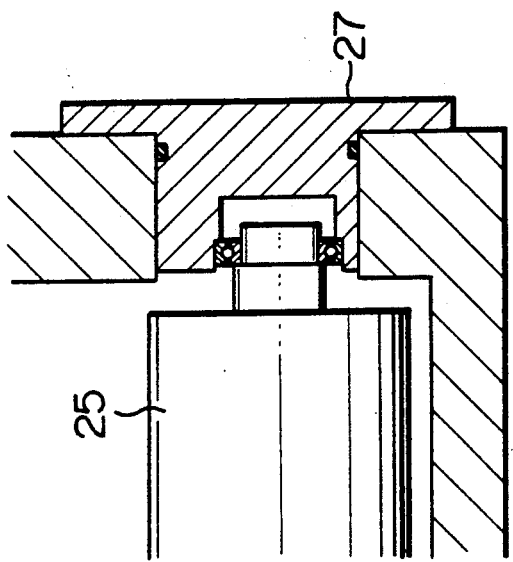

CONTINUOUS VACUUM PROCESSING APPARATUS

BACKGROUND OF THE INVENTION

1. Field of the Invention

The present invention relates to a continuous vacuum processing apparatus for continuously plasma processing or deposition processing in a vacuum various objects including plastic parts, such as polyethylene terephthalate films, natural and synthetic fibers, and steel plates to be coated.

2. Description of the Prior Art

U.S. Pat. No. 3,057,792 discloses a continuous vacuum processing apparatus of the above-described type which has a slit-type sealing device. The slit-type sealing device of this apparatus only provides sealing thereof, and no consideration is given to damage to the material to be processed, which may be caused by contact of the sealing portion therewith, making the apparatus unsuitable for use in processing high quality materials such as transparent conductive films. Japanese Patent Laid-Open No. 4866/1987 discloses another type of continuous vacuum processing apparatus. This apparatus, however, does not include means for detecting the tension of the material to be processed, and therefore is disadvantageous in that the material to be processed may be slack or wrinkled. It also suffers from the problem that the material to be processed may be damaged by dust entering the slit.

SUMMARY OF THE INVENTION

Accordingly, an object of the present invention is to provide a continuous vacuum processing apparatus capable of processing material to be processed without bringing it into contact with the sealing portion and damaging it, and which is therefore suitable for use in processing high quality materials such as transparent conductive films.

Another object of the present invention is to provide a continuous vacuum processing apparatus which is capable of preventing the material to be processed from being damaged by preventing dust and dirt from entering the slit portion, and which is therefore suitable for use in processing the above-described high quality materials.

To this end, the present invention provides, in one of its aspects, a continuous vacuum processing apparatus which is characterized in that a preliminary and a post vacuum chamber each has a slit-type sealing device for sealing the vacuum processing chamber from the outside thereof. An object to be processed is passed through the sealing device and a guiding member for guiding the object to be processed is provided at each of the two sides of the sealing device or at one side thereof. The guiding member is provided in such a manner as to be movable in a direction perpendicular to the direction in which the object is conveyed in accordance with the tension of the object detected by a tension detecting means. Further a slit forming member of the sealing device is made movable in the direction perpendicular to the direction of conveyance of the object.

In this vacuum processing apparatus, a guide roller is disposed at each of the two sides of the slit-type sealing device or at one side thereof so as to prevent the object from coming into contact with the sealing portion. The sealing gap can be adjusted in accordance with the thickness of the object. In consequence, the object to be processed can be conveyed without bringing it into contact with the sealing device by applying tension to the object by another means. Further, since nothing slides against the sealing device, no powder adheres to the object to be processed.

The present invention provides, in another of its aspects, a continuous vacuum processing apparatus, which is characterized in that a preliminary and a post vacuum chamber each has a slit-type sealing device for sealing the vacuum processing chamber from the outside thereof. An object to be processed is passed through the sealing device and a guiding member for guiding the object is provided at each of the two sides of the sealing device or at one side thereof. An air outlet is provided within the slit portion.

In this vacuum processing apparatus, the entrance of foreign matter into the sealing device can be prevented by venting air from the air outlet provided in the slit-type sealing device. Further, the object to be processed may be vibrated, loosened or wrinkled while it is being conveyed by the turbulent flow of air caused by the differences in pressure in the sealing device and the outside thereof, and the position thereof may be thereby varied. However, the object can be floated on air ejected from the air outlet, and contact of the object with the sealing device can be thereby prevented. Still further, deposition of foreign matter existing within the sealing device on sealing elements can be prevented by venting air from the air outlet provided within the sealing device while the movement of the object to be processed has stopped. As a result, damage to the object that may occur while it is being passed through the sealing device can be prevented.

The present invention provides, in another of its aspects, a continuous vacuum processing apparatus which is characterized in that a preliminary and a post vacuum chamber each has a slit-type sealing device for sealing the vacuum processing chamber from the outside thereof. An object to be processed is conveyed through the sealing device. The apparatus also includes a guiding member disposed at each of the two sides of the sealing device or at one side thereof for guiding the object to be processed, means for detecting the thickness of the object to be processed, and means for controlling the gap of the slit-type sealing device using the signals from the detecting means.

In this vacuum processing apparatus, the thickness detecting means detects the thickness of the object to be processed before the object is fed into the sealing device, and the control means controls the gap of the slit-type sealing device using the signals from the detecting means. In consequence, the gap of the slit-type sealing device can be set to an optimum value corresponding to the thickness of the object to be processed, thus enabling objects having various thicknesses to be conveyed.

BRIEF DESCRIPTION OF THE DRAWINGS

For a better understanding of these and other objects of the present invention, reference is had to the following detailed description of the invention to be read in conjunction with the following drawings, wherein:

FIG. 14 is a section taken along the line XIV—XIV of FIG. 3, showing another embodiment of the present invention;

FIG. 15 is an enlarged view of a portion G of FIG. 14;

FIG. 16 is a section taken along the line XVI—XVI of FIG. 14, explaining the eccentricity;

DESCRIPTION OF THE PREFERRED EMBODIMENTS

Figure 1:
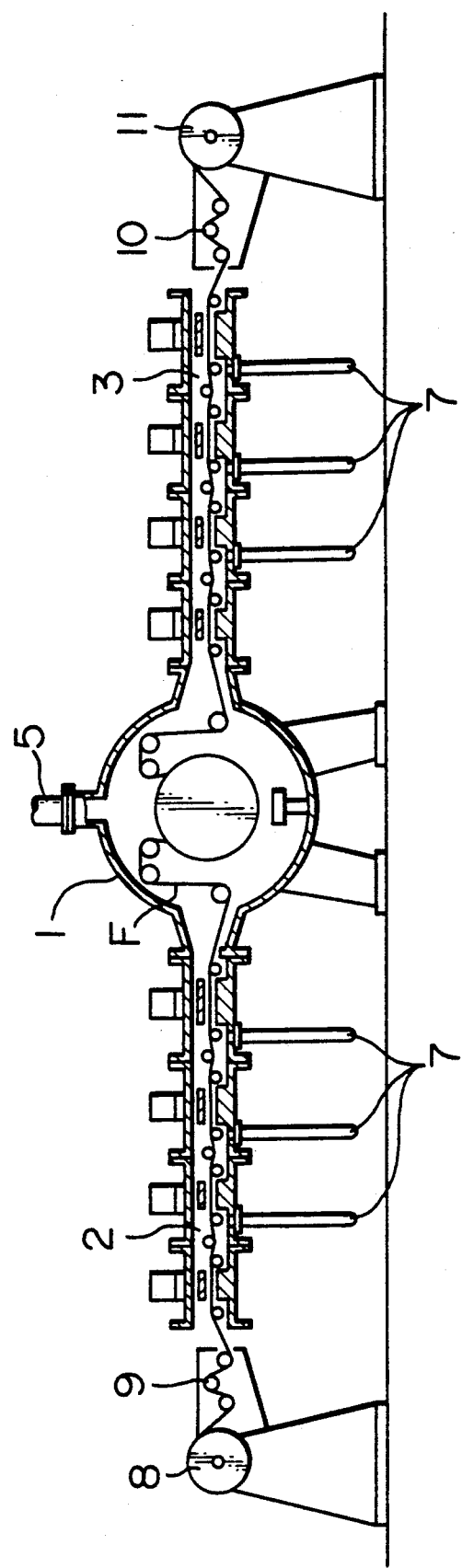
FIG. 1 is a schematic longitudinal sectional view of a continuous vacuum processing apparatus.
Figure 2:
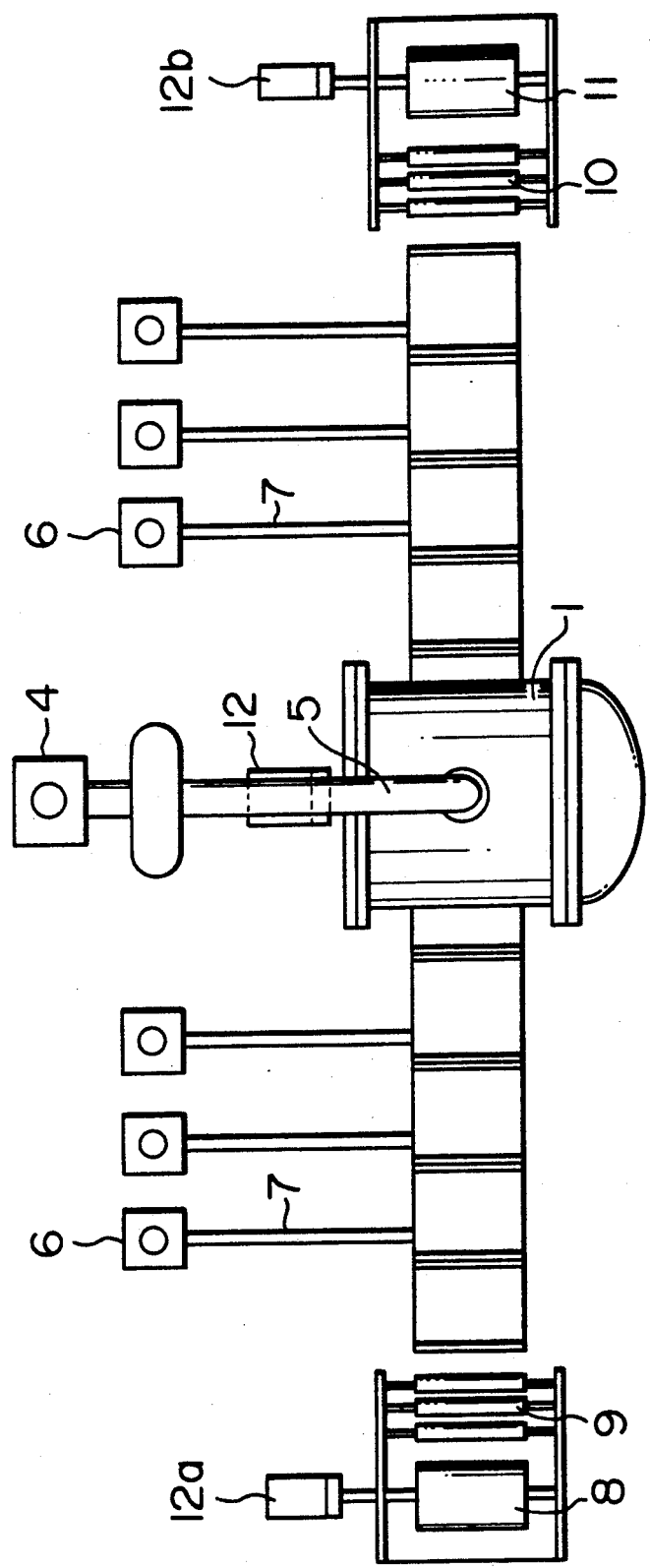
FIG. 2 is a schematic plan view of the apparatus of FIG. 1.

A first embodiment of the present invention will be described below with reference to FIGS. 1 to 2. A continuous vacuum processing apparatus includes a vacuum processing chamber 1 in which a flexible object to be processed F is subjected to continuous plasma processing under vacuum, a preliminary vacuum chamber 2 disposed in advance of the vacuum processing chamber 1, and a preliminary vacuum chamber 3 disposed subsequent to the vacuum processing chamber 1. The interior of the vacuum processing chamber 1 is evacuated by a vacuum pump 4 connected thereto through a pipe 5 so as to provide a vacuum of about $10^{-3}$ Torrs.

Each of the vacuum chambers 2 and 3 is evacuated by vacuum pumps 6 connected thereto through corresponding pipes 7 so as to provide vacuums whose pressures are slighly higher than the vacuum pressure in the vacuum processing chamber 1 and which decrease in stepwise fashion from atmospheric pressure.

After being fed out of an unwind shaft 8, an object to be processed F is fed first through a guide roller 9 for controlling the tension of the object F located within the forward preliminary vacuum chamber, then through the forward preliminary vacuum chamber 2, to the vacuum processing chamber 1, where it is plasma processed. Thereafter, it is passed through the rear post vacuum chamber 3, and is wound around a wind-up shaft 11 through a guide roller 10 for controlling the tension of the object located within the rear post vacuum chamber. DC motors 12a and 12b are used to convey the object to be processed F. The object is conveyed without generating wrinkles by the detection of the tension of the guide rollers 9 and 10. The conveying speed can be suitably adjusted.

Figure 3:
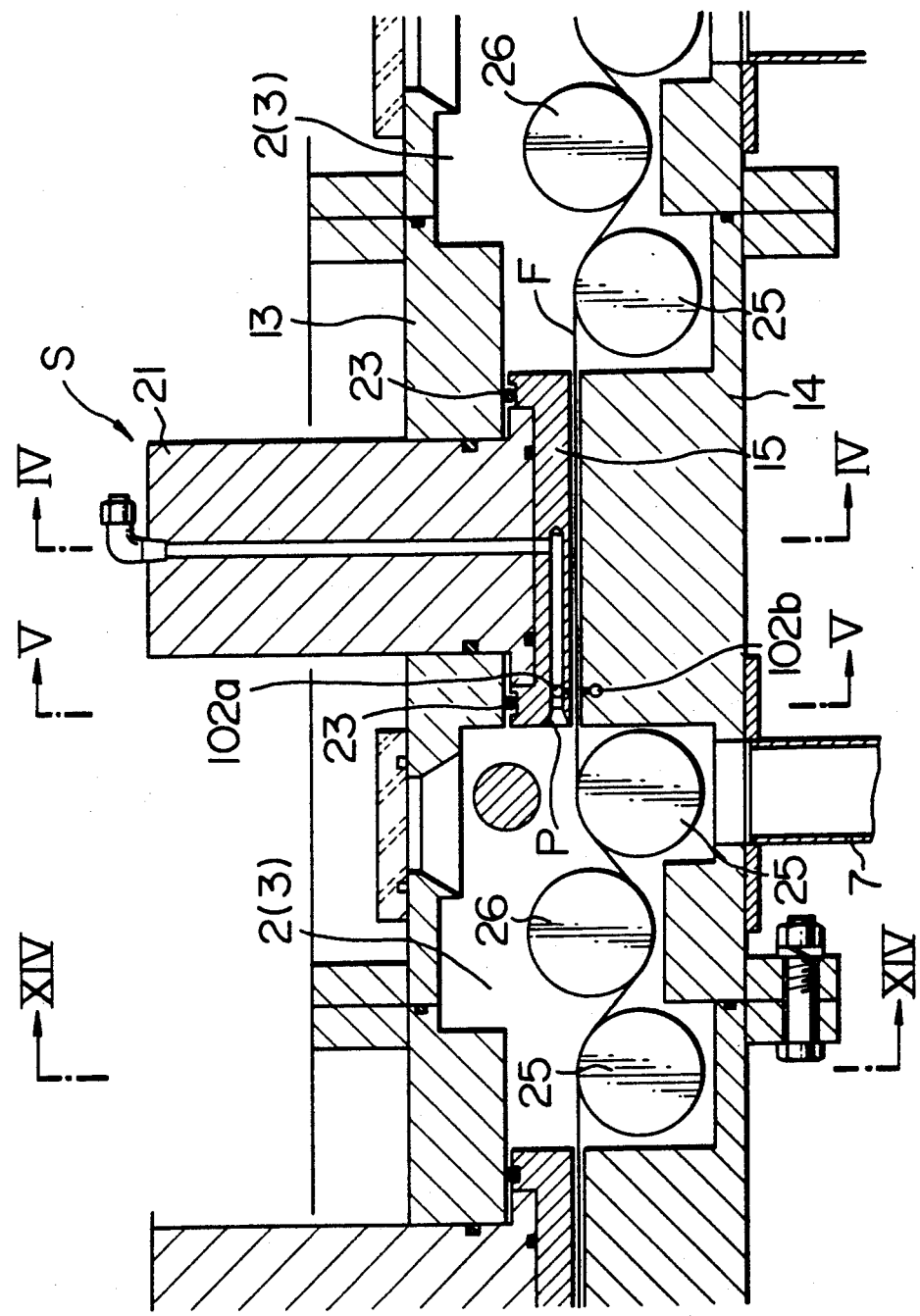
FIG. 3 is a longitudinal sectional view of a sealing device.
Figure 4:
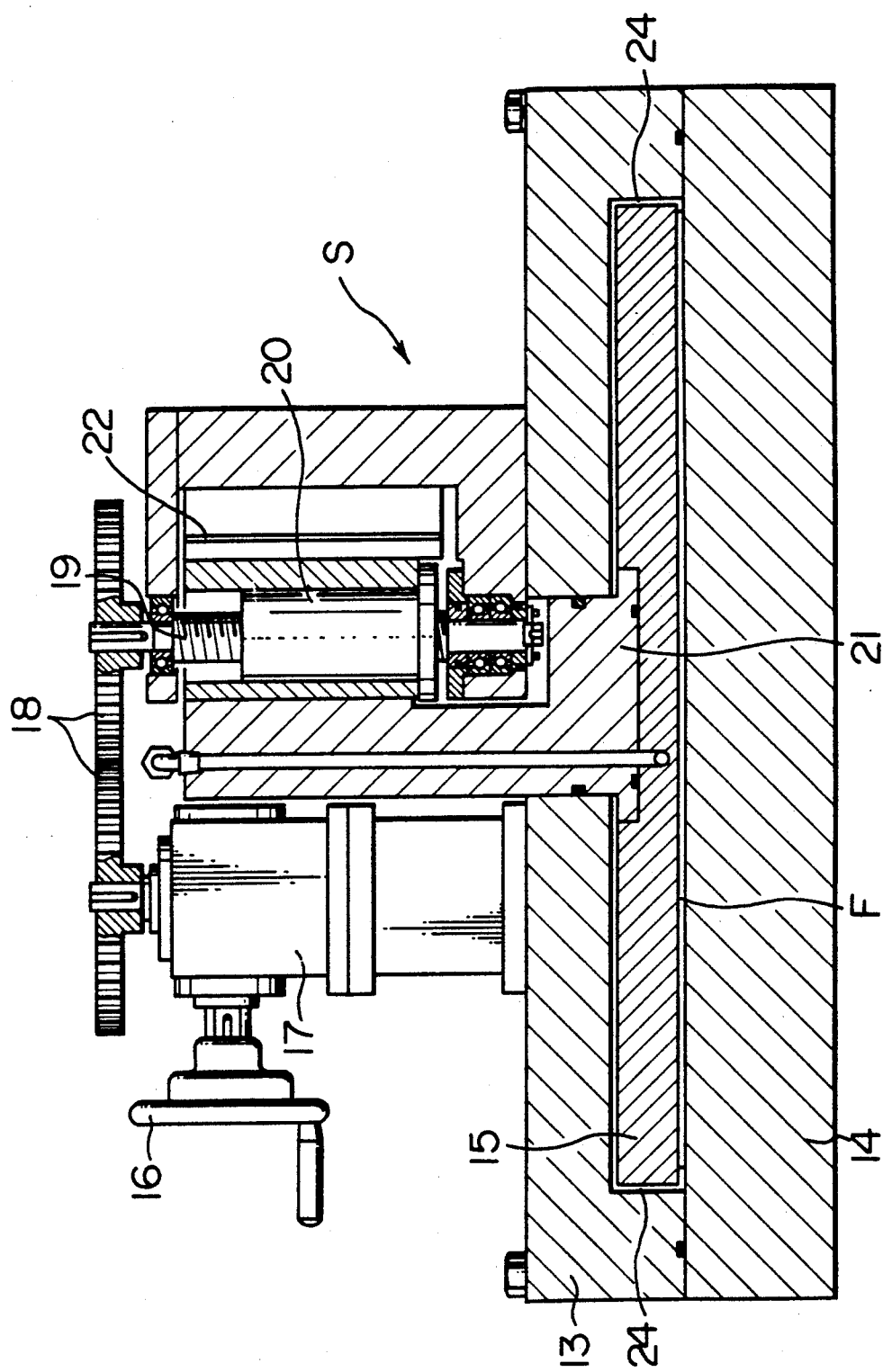
FIG. 4 is a section taken along the line IV—IV of FIG. 3.
Figure 5:
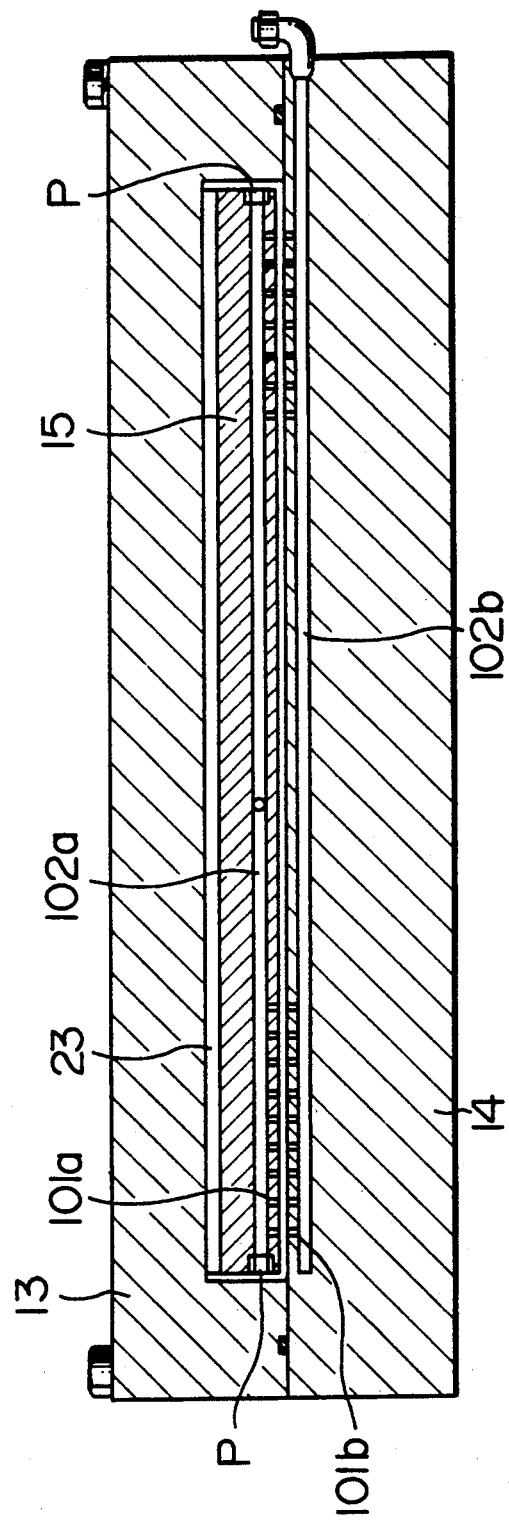
FIG. 5 is a section taken along the line V—V of FIG. 3.

FIG. 3 shows a sealing device which constitutes each of the vacuum chambers 2 and 3, FIG. 4 is a section taken along the line IV—IV of FIG. 3, and FIG. 5 is a section taken along the line V—V of FIG. 3. A sealing device S comprises an upper casing 13, a lower casing 14, and a sealing block 15 supported by the upper casing 13. The object to be processed F is conveyed in a slit formed by the lower casing 14 and the sealing block 15 without contacting them.

The sealing block 15 and a column 21 integrally formed therewith are moved in the vertical direction in accordance with the thickness of the material to be processed F through a speed-reduction gear 17, gears 18, a ball screw 19, and a nut 20 by rotating a handle 16. During the vertical movement, the sealing block 15 is guided by a guide 22. Sealing between the upper casing 13 and the sealing block 15 is provided by an O-ring 23. The O-ring 23 should have enough elasticity to provide sealing between the upper casing 13 and the sealing block 15 even when the sealing block 15 is moved in the vertical direction (a maximum of 2 mm). Each of gaps 24 formed between the sides of the upper casing 13 and the sides of the sealing block 15 is set to the smallest possible value (for example, 30 microns) at which the sealing block 15 can be moved smoothly in the vertical direction but the amount of air leakage can be minimized. The material to be processed F is guided during conveyance by guide rollers 25. Each of the guide rollers 25 is located such that the peripheral surface thereof is higher than the sealing surface of the lower casing 14 so as to prevent the material to be processed F from coming into contact with the lower casing 14. In normal operation, the guide rollers 25 and the sealing block 15 are positioned such that the gaps formed between the material to be processed F and the sealing block 15 and between the material to be processed F and the lower casing 14 are respectively at 0.1 mm. A tension applying roll 26 is adapted to increase the angle at which the material to be processed F is wound around the guide rollers 25 and to apply tension to the material to be processed F. It therefore prevents vibrations in the material to be processed and the contact thereof to the wall surface of the sealing portion. The sealing devices which respectively form the vacuum chambers 2 and 3 are symmetrical to each other, and are evacuated by the corresponding vacuum pumps 6 through the corresponding pipes 7.

The entrance of foreign matter into each of the sealing devices during the conveyance of the object to be processed is prevented by venting air introduced through a pressurized air passage 102b provided in the lower casing 14 from air outlets 101b aligned by a pitch of 10 mm and by venting air introduced through an air introducing passage 102a provided in the sealing block 15 from sixty air outlets 101a aligned by a pitch of 10 mm, the air being ejected while the pressure thereof is being adjusted. The two ends of the air introducing passage 102a are closed by plugs P, and the air outlets 101a provided in the sealing block 15 and the air outlets 101b provided in the lower casing 14 are provided vertically or at an angle with respect to the sealing surfaces of the sealing block 15 and the lower casing 14 because the air is vented toward the atmosphere. In consequence, damage to the interior of the sealing device caused by the foreign matter that enters it can be prevented, and damage to the material to be processed F caused by the contact thereof with the foreign matter that enters the sealing device can also be prevented. Further, while the material to be processed is being conveyed, it may be vibrated, loosened or wrinkled by the turbulent flow of air caused by the differences in pressure in the sealing device and the outside thereof, and the position thereof is thereby varied within the sealing device. However, the material to be processed F can be floated on air and the position thereof is thereby stabilized by venting the air introduced in the manner described above from the air outlets 101a and 101b while adjusting the air pressure, allowing the material to be processed to be conveyed without contacting the sealing block 15 or the lower casing 14. Still further, if the air introduced through the air introducing passages 102a and 102b is vented from the air outlets 101a and 101b while the movement of the object to be processed has stopped, deposition of a small amount of foreign matter that is considered to exist within the sealing device on the sealing block 15 and lower casing 14 can be prevented. The two ends of the hole 102a are closed by the plugs P, and the air outlets 101a and 101b are respectively provided vertically or at an angle with respect to the sealing surfaces of the lower casing 14 and the sealing block 15 because the air is vented toward a high pressure portion. In consequence, deterioration of the sealing block 15 and the lower casing 14 can be prevented, and the contact of the object to be processed with the sealing block or the lower casing can be thereby prevented, thereby preventing damage to the material to be processed F caused by the contact. In the sealing device shown in FIGS. 3 to 5, each of the slit-like sealing portions of the sealing devices is provided with one row of air outlets. However, two or three rows of air outlets may also be provided in each sealing portion, depending on the size of the sealing device.

Figure 6:
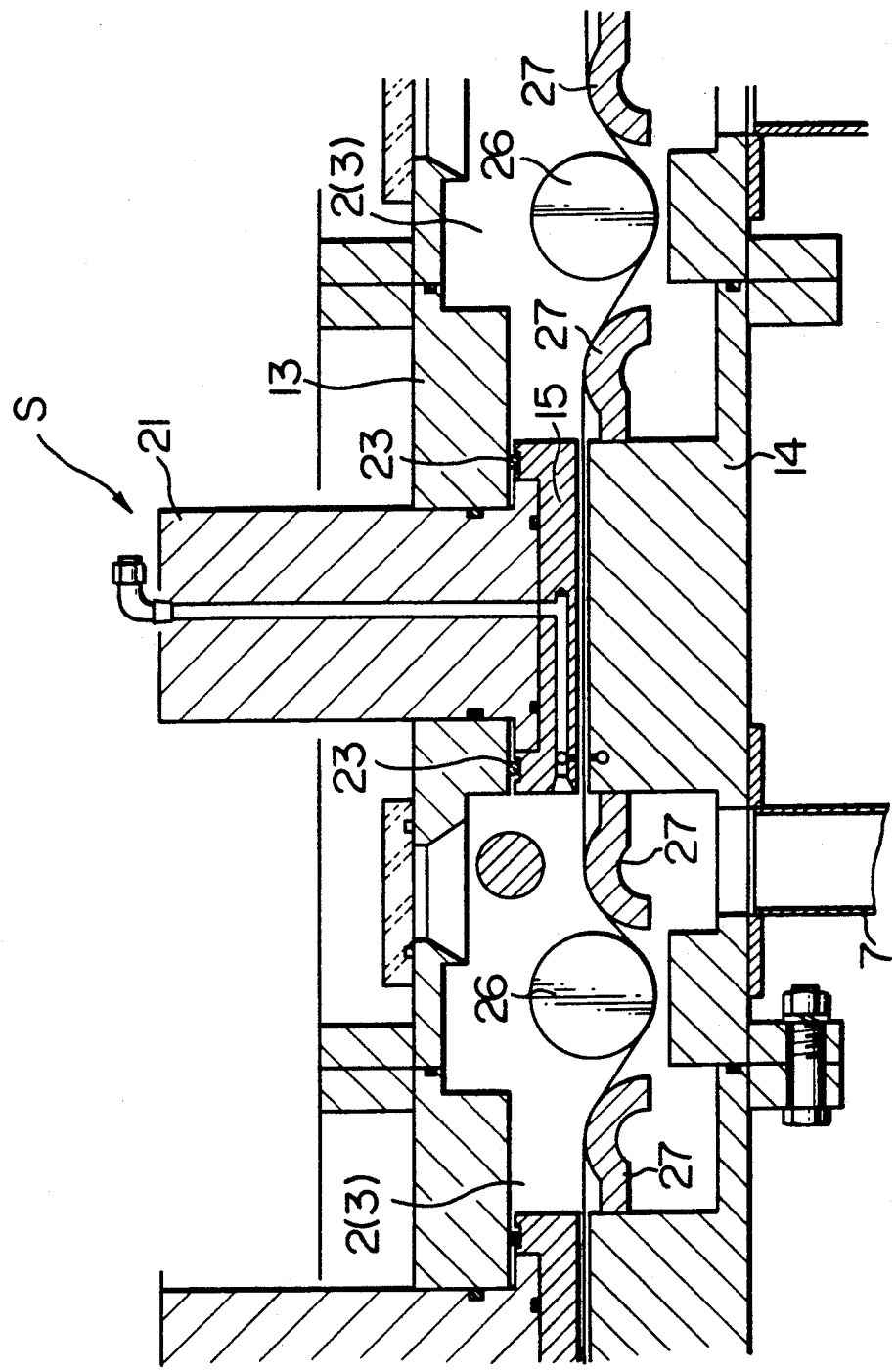
FIG. 6 is a sectional view of another example of a guiding member.

FIG. 6 shows another example of a guiding member. In this example, an arcuate guiding plate 27 is used in place of the guide roller. In this way, weight applied to a thin object to be processed F can be reduced at the beginning of its conveyance, and cutting or damage of the material to be processed F can be thereby prevented.

Figure 7:
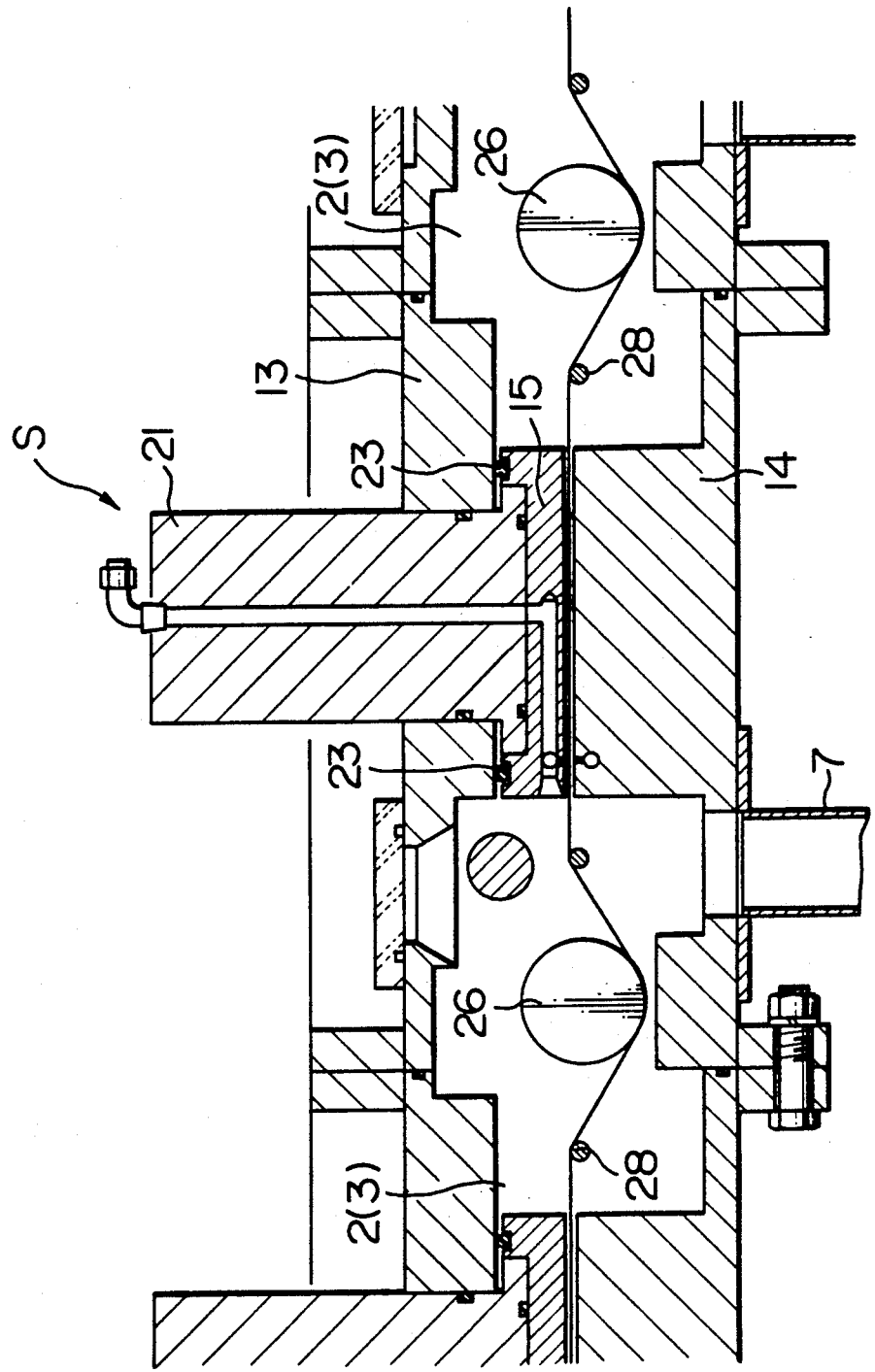
FIG. 7 is a sectional view of still another example of a guiding member.

FIG. 7 shows still another example of the guide member. In this example, a guide rod 28 is employed in place of the guide roller. Like the example shown in FIG. 6, this example is also effective in preventing cutting of or damage to a thin object to be processed F.

Figure 8:
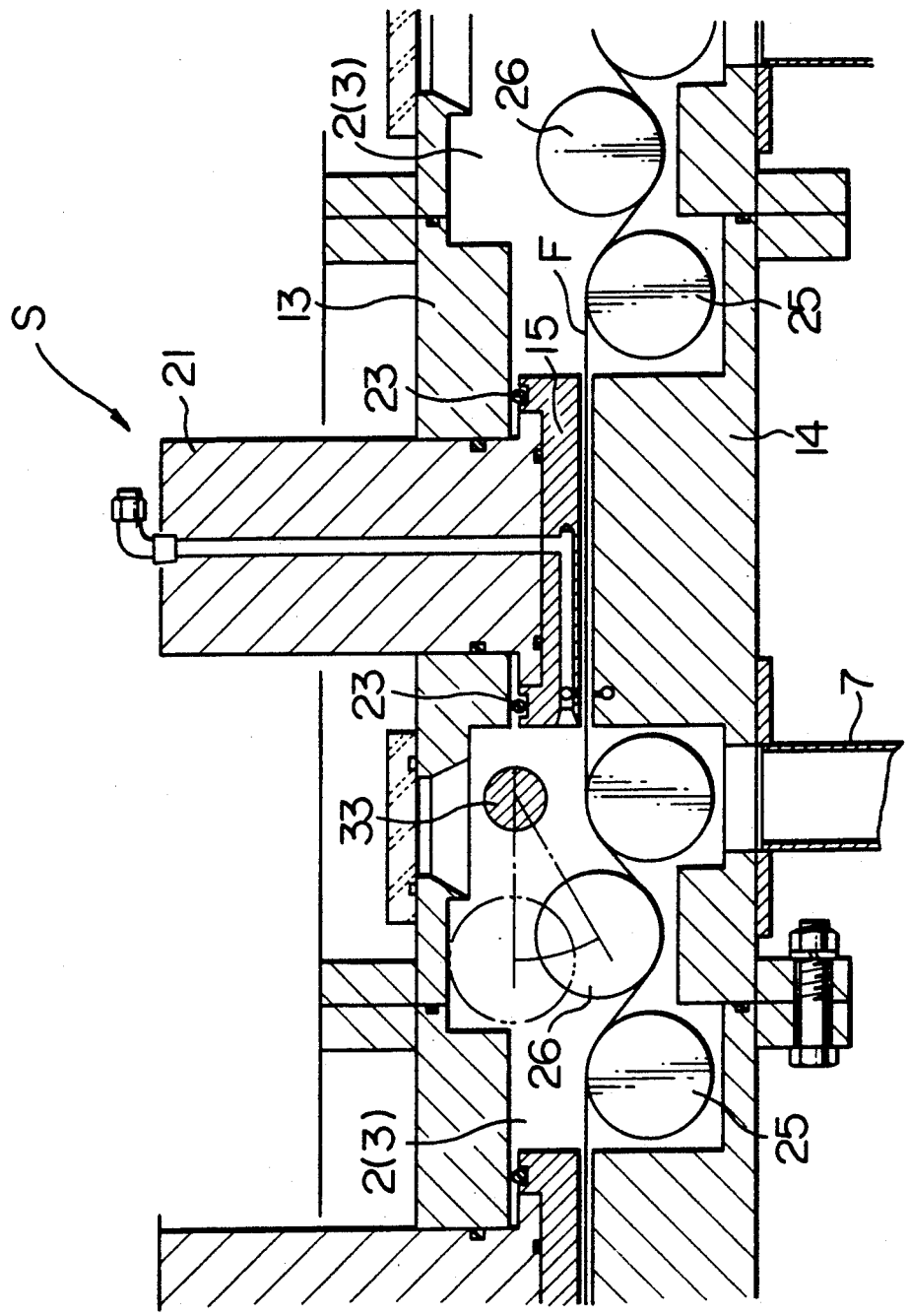
FIG. 8 is a cross-sectional view of another example of a tension applying means.
Figure 9:
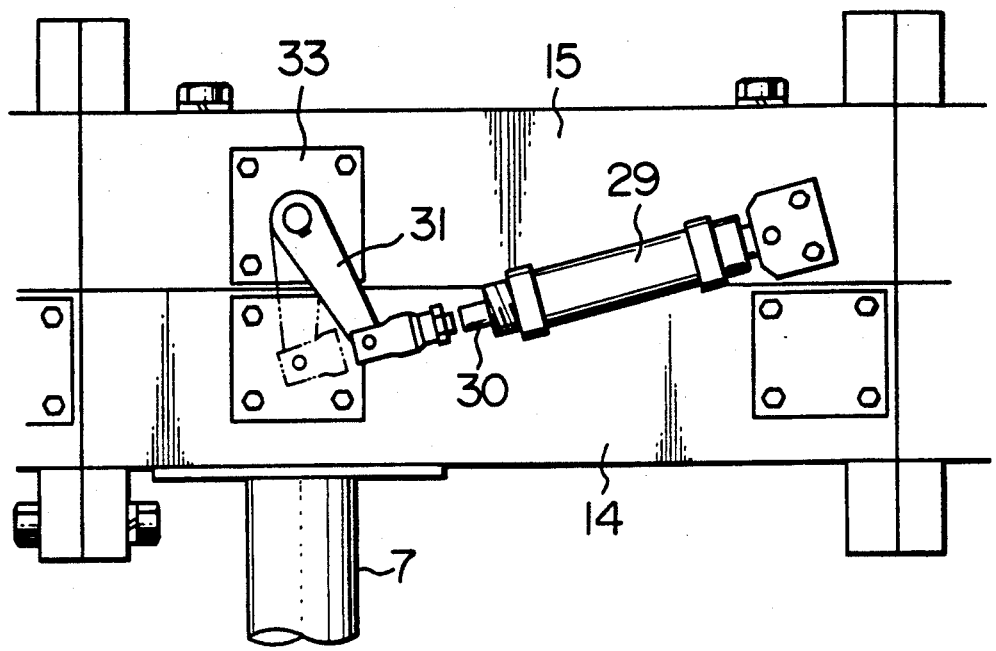
FIG. 9 is a side elevational view of part of the tension applying means of FIG. 8.
Figure 10:
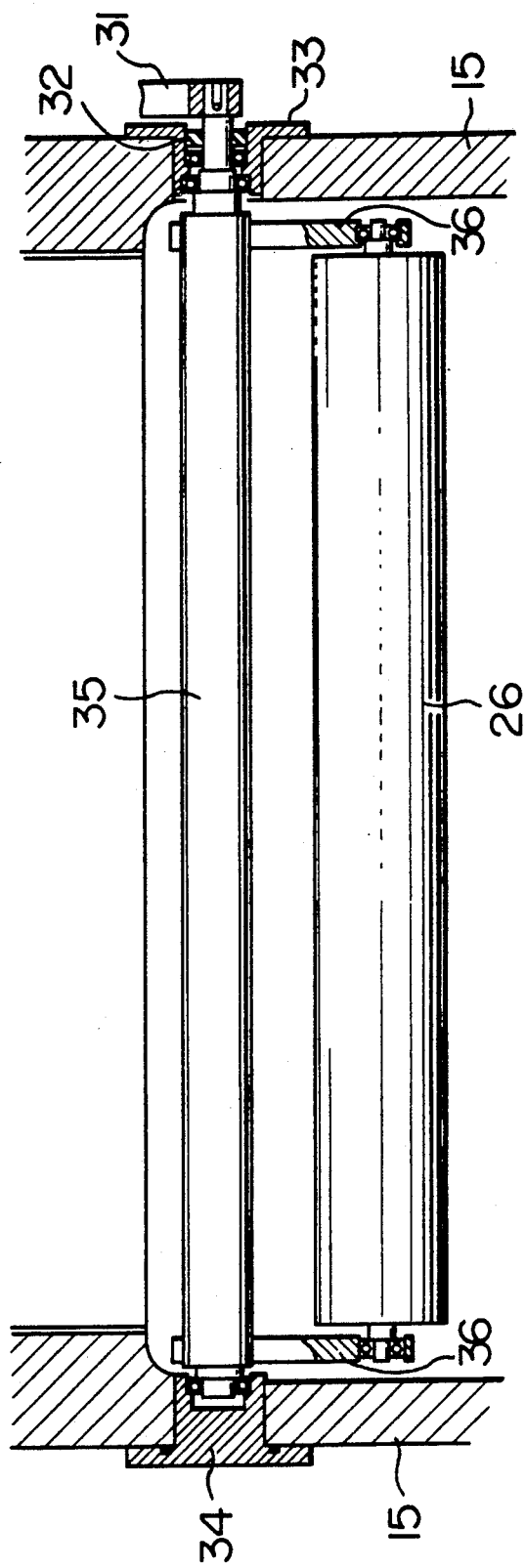
FIG. 10 shows a tension applying roll in detail.

FIG. 8 is a cross-sectional view of another example of a tension applying roll which is made movable in the vertical direction, FIG. 9 is a side elevational view of part of the roll of FIG. 8, and FIG. 10 shows the tension applying roll in detail.

In this example, a tension applying roll moving mechanism includes an air cylinder 29, an air piston 30, an arm 31 for rotating an arm shaft, an oil seal 32 for the arm shaft, bearing housings 33 and 34, an arm shaft 35, and an arm 36 mounted on the arm shaft for moving the tension applying roll 26. This tension applying roll moving mechanism is operated in the manner described below: the piston 30 provided in the air cylinder 29 is motioned by an air so as to move the arm 31. Movement of the arm 31 is transmitted to the arm shaft 35, whereupon the arm shaft 35 is rotated about the radial center thereof. The arm shaft 35 is supported by the bearing housings 33 and 34 through bearings, and sealing of the arm shaft is provided by the oil seal 32.

Rotation of the arm shaft 35 rotates the arm 36 about its radial center, which in turn rotates the guide roller 26 supported by the ends of the arm 36. This allows the guide roller 26 to be located at a higher position as viewed in FIG. 3 than the under surface of the sealing block 15 at the beginning of conveyance of the object to be processed, enabling the object to be processed to be passed smoothly. On the other hand, while the object to be processed is being conveyed, the lowermost portion of the tension applying roll 26 is at a position lower than the upper surface of the lower casing 14, by which a suitable tension is applied to the object to be processed F. As a result, damage to the object to be processed F caused by the contact thereof with the slit portion can be prevented.

In this example, the object to be processed F can be smoothly passed through the sealing device at the beginning of the conveyance. Further, since a suitable tension is applied to the object to be processed F, contact of the object with the sealing device and hence the damage to the object caused by the contact can be prevented.

Next, examples in which a suitable tension is applied to the material to be processed F using a tension detecting means will be described below.

If the tension detecting means is to be provided outside the vacuum chambers 2 and 3, it is mounted on each of the guide rollers 9 and 10. In that case, the tension of the material to be processed F located within the preliminary vacuum chamber 2 is detected through the guide roller 9 by a detecting means to be described later, and the unwind roll 8 is controlled using the signals from the detecting means such that the tension applied to the material to be processed F is optimized. Similarly, the tension of the material to be processed F located at the rear side is detected through the guide roller 10 by a detecting means, and the wind-up shaft 11 is controlled using the signals from the detecting means such that the tension applied to the material to be processed F becomes optimal. Therefore, the material to be processed F is held at a suitable tension by the front detecting means, the control means associated with the front detecting means, the rear detecting means, and the control means associated with the rear detecting means, and it is thereby not loosened or wrinkled. As a result, the material to be processed can be conveyed without making contact with the lower casing 14 and the sealing block 15, thereby preventing the damage to the material to be processed F.

In a case where the tension detecting means is provided within the vacuum chambers 2 and 3, it is mounted on one of the guide rollers 26 in each of the sealing devices that constitute the vacuum chambers 2 and 3. In that case, the tension of the material to be processed F located at the front side is detected through the guide roller 26 provided in the front sealing device, and the unwind roll 8 is controlled using the signals from the detecting means such that it applies an optimum tension to the material to be processed F. Similarly, the tension of the material to be processed F located at the rear side is detected through the guide roller 26 provided in the rear sealing device, and the wind-up shaft 11 is controlled using the signals from the detecting means such that the tension applied to the material to be processed F is optimized. Therefore, the material to be processed F can be held at a suitable tension by the front detecting means, the control means associated with the front detecting means, the rear detecting means, and the control means associated with the rear detecting means, and it can be thereby conveyed without coming into contact with the lower casing 14 and the sealing block 15. This can prevent the damage to the material to be processed F.

Figure 11:
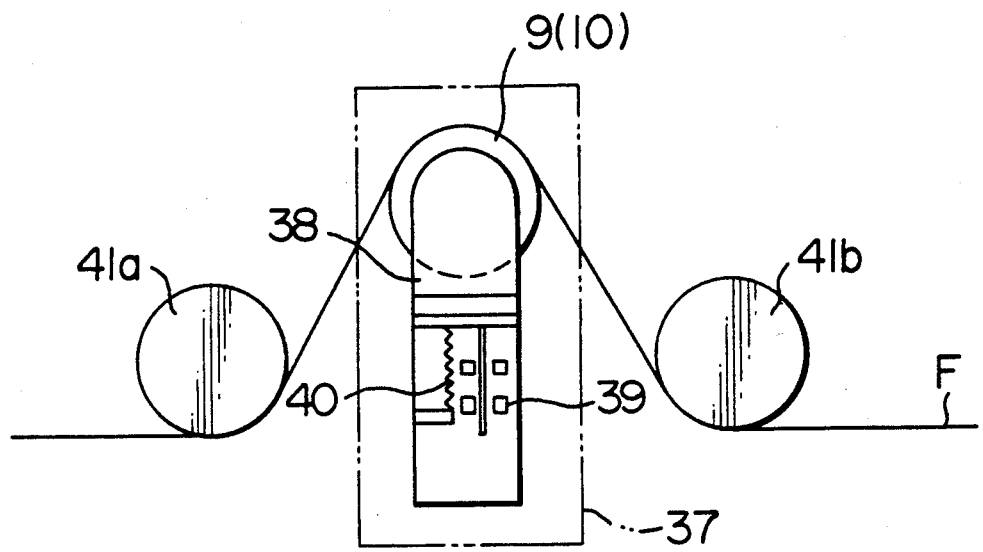
FIG. 11 shows an example of means for detecting the tension of material to be processed.
Figure 12:
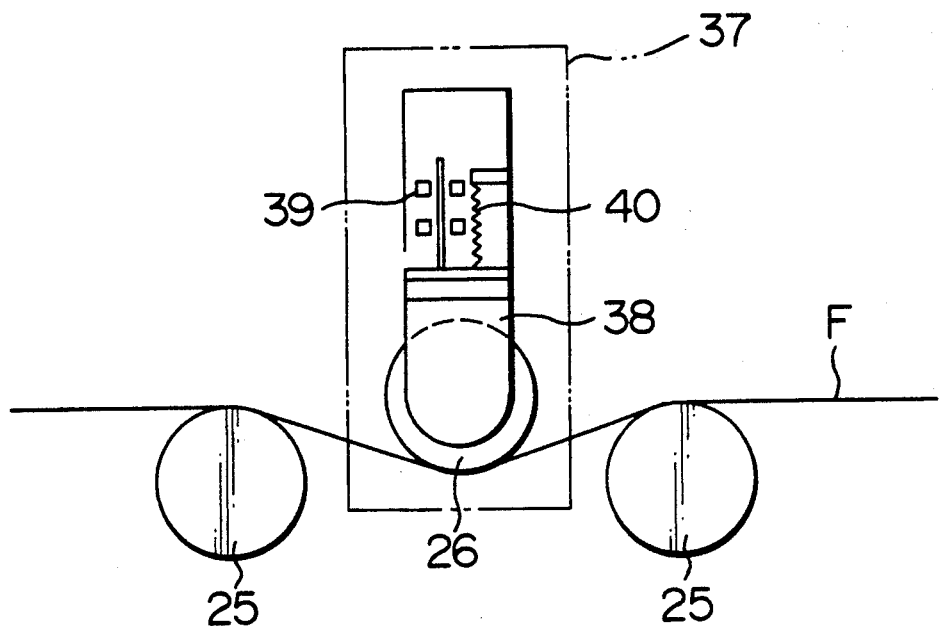
FIG. 12 shows another example of the tension detecting means.

FIG. 11 shows an example of means for detecting the tension of the material to be processed F which is provided outside the vacuum chamber 2 or 3, and FIG. 12 shows an example of the tension detecting means which is provided within each of the vacuum chambers 2 and 3. A tension detector 37 includes the guide roller 9 (10) in the example shown in FIG. 11 or the guide roller 26 in the example shown in FIG. 12, a bearing unit 38 for supporting the part of the guide roller 9 (10) or the guide roller 26, a differential transformer 39 connected to the bearing unit 38, and a spring 40. The tension detector 37 is provided between two guide rollers 41a and 41b in the example shown in FIG. 11 or between the two guide rollers 25 in the example of FIG. 12. In this tension detector 37, as the tension of the material to be processed F increases, the guide roller 9 (10) or 26 moves against the force of the spring 40. As the tension decreases, it moves by the expanding force of the spring 40. The differential transformer 39 generates an output voltage which represents the amount of movement of the guide roller 9 (10) or 26.

Figure 13:
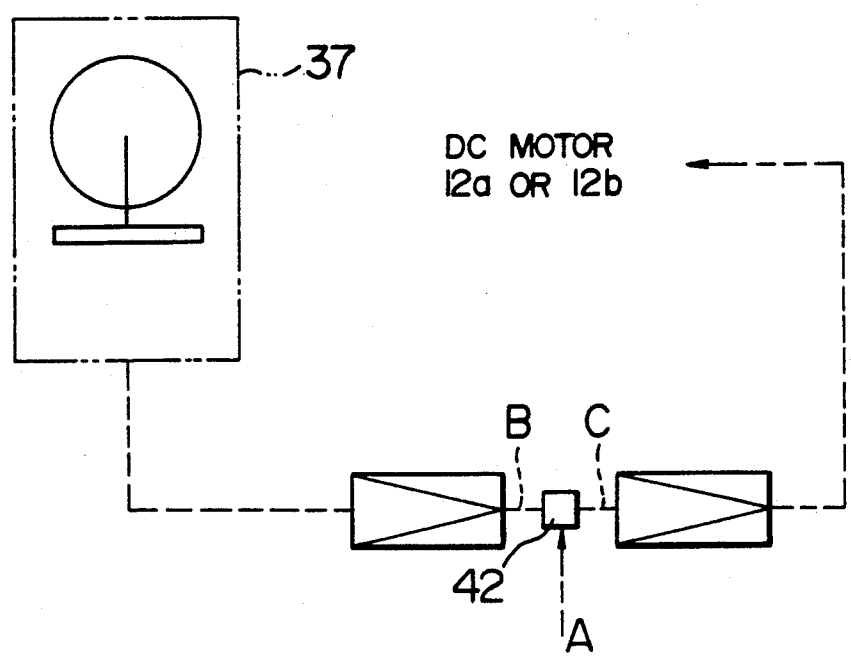
FIG. 13 is a block diagram of a control system for the tension detecting means.

FIG. 13 is a block diagram of the control system of the tension detecting means.

In FIG. 13, a comparator 42 compares a set signal A which represents an optimal tension of the material to be processed F, i.e., a set tension, with a detected signal B which represents the tension actually detected by the tension detector 37, and supplies a deflection signal C representing the difference between the signals A and B to the DC motor 12a for driving the unwind roll or the DC motor 12b for driving the wind-up shaft. The set tension signal A is set beforehand at a suitable value in accordance with the material or thickness of the object to be processed F.

When the tension of the material to be processed F increases, the guide roller 9 (10) or 26 of the tension detector 37 moves against the force of the spring 40, and the amount of movement of the guide roller 9 (10) or 26 is converted to a voltage by the differential transformer 39. The comparator 42 compares the thus-detected signal B and the set signal A, and supplied the deflection signal C to the unwind roll 8 or the wind-up shaft 11, by which the tension is controlled at the set value. Further, when the tension of the material to be processed F decreases, it can be set to the set value by the similar detecting and control operations.

Thus, the tension of the material to be processed F is detected while it is being conveyed, and it is controlled at an optimum value using the detection signal. Therefore, the material to be processed F is not loosened or wrinkled, and can be conveyed without coming into contact with the lower casing or the sealing block. This can prevent the damage to the material to be processed F.

In these examples of application of the optimum tension to the object to be processed F, the material to be processed F can be conveyed without coming into contact with the sealing device, and the damage that occurs to the object to be processed F can be thereby prevented.

FIG. 14 is a section taken along the line of XIV—XIV of FIG. 3, showing another example of the guide roller which is made movable in the vertical direction, FIG. 15 shows the G portion of FIG. 14 in detail, and FIG. 16 is a section taken along the line of XVI—XVI. In this example, a guide roller 25 has a shaft 43, and each of the two ends of the shaft 43 is supported by an eccentric bearing cartridge 44. The eccentric bearing cartridge 44 is automatically or manually rotated. As it rotates, the shaft 43 of the guide roller whose center is deviated from the center of the bearing cartridge 44 by a distance L is rotated about the center of the rotary shaft of the eccentric bearing cartridge 44, moving the guide roller 25, as shown by the dashed line in FIG. 16, and thereby displacing the uppermost portion of the guide roller 25 by I before and after the rotation of the guide roller 25. The mechanism of moving the uppermost portion of the guide roller 25 enables the object to be processed F guided by the guide roller 25 to be located at an optimum position between the lower casing 14 and the sealing block 15, i.e., it prevents the damage to the material to be processed F caused by the contact thereof with the lower casing 14. Further, since the position of the material to be processed F can be varied in accordance with the type thereof, the position of the sealing block can be varied in accordance with the position of the object to be processed. As a result, the contact of the object to be processed with the sealing block can be prevented, and a gap formed between the lower casing 14 and the sealing block 15 can be minimized, making it possible for an optimum sealed state to be maintained.

In this example, since the position of the object to be processed F can be set at the optimum position, damage to the object to be processed F which is caused by the contact thereof with the slit-type sealing portion can be prevented, and the gap of the slit can be set at the optimum value.

Figure 17:
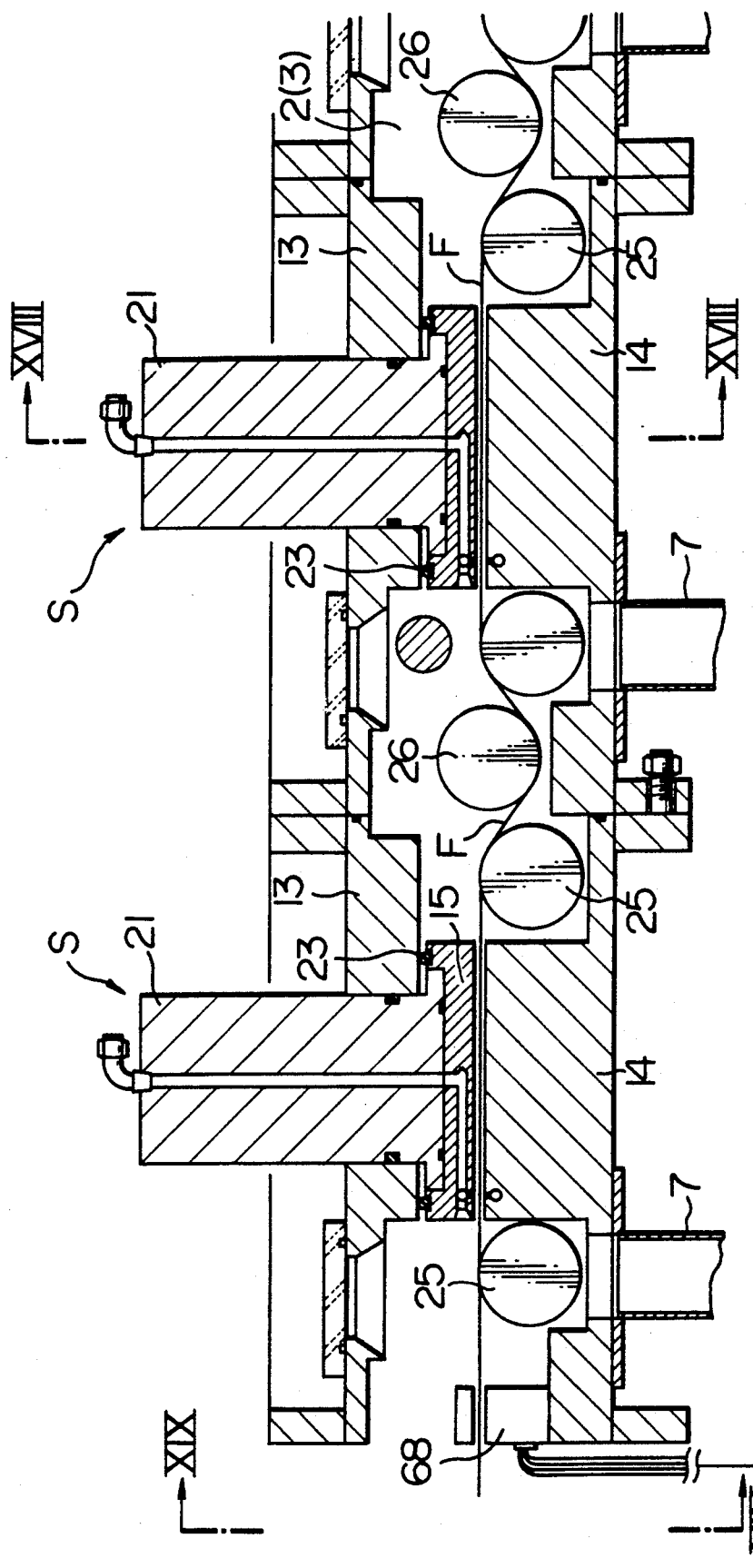
FIG. 17 is a longitudinal sectional view of another example of the sealing device.
Figure 18:
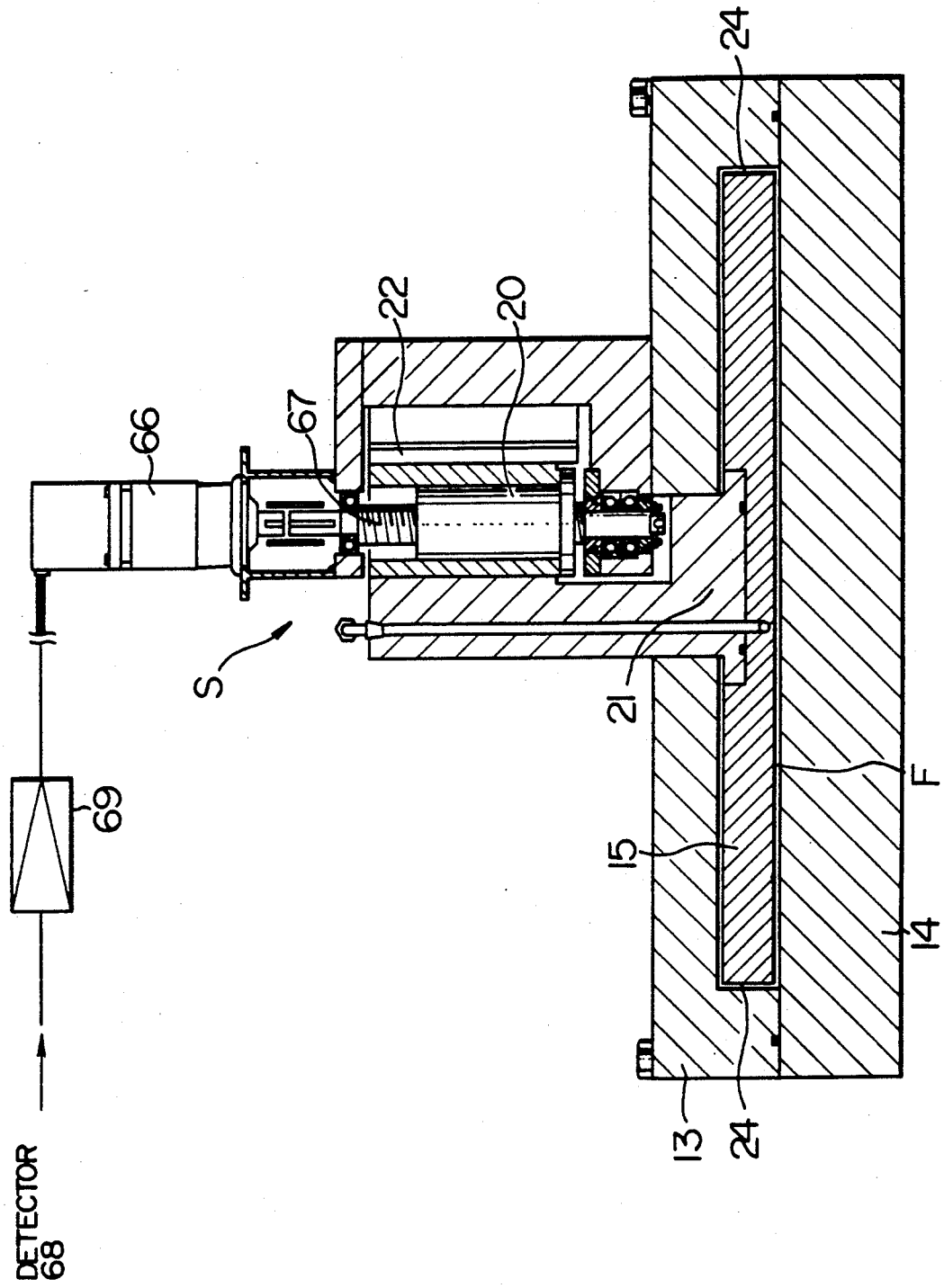
FIG. 18 is a section taken along the line XVIII—XVIII of FIG. 17.
Figure 19:
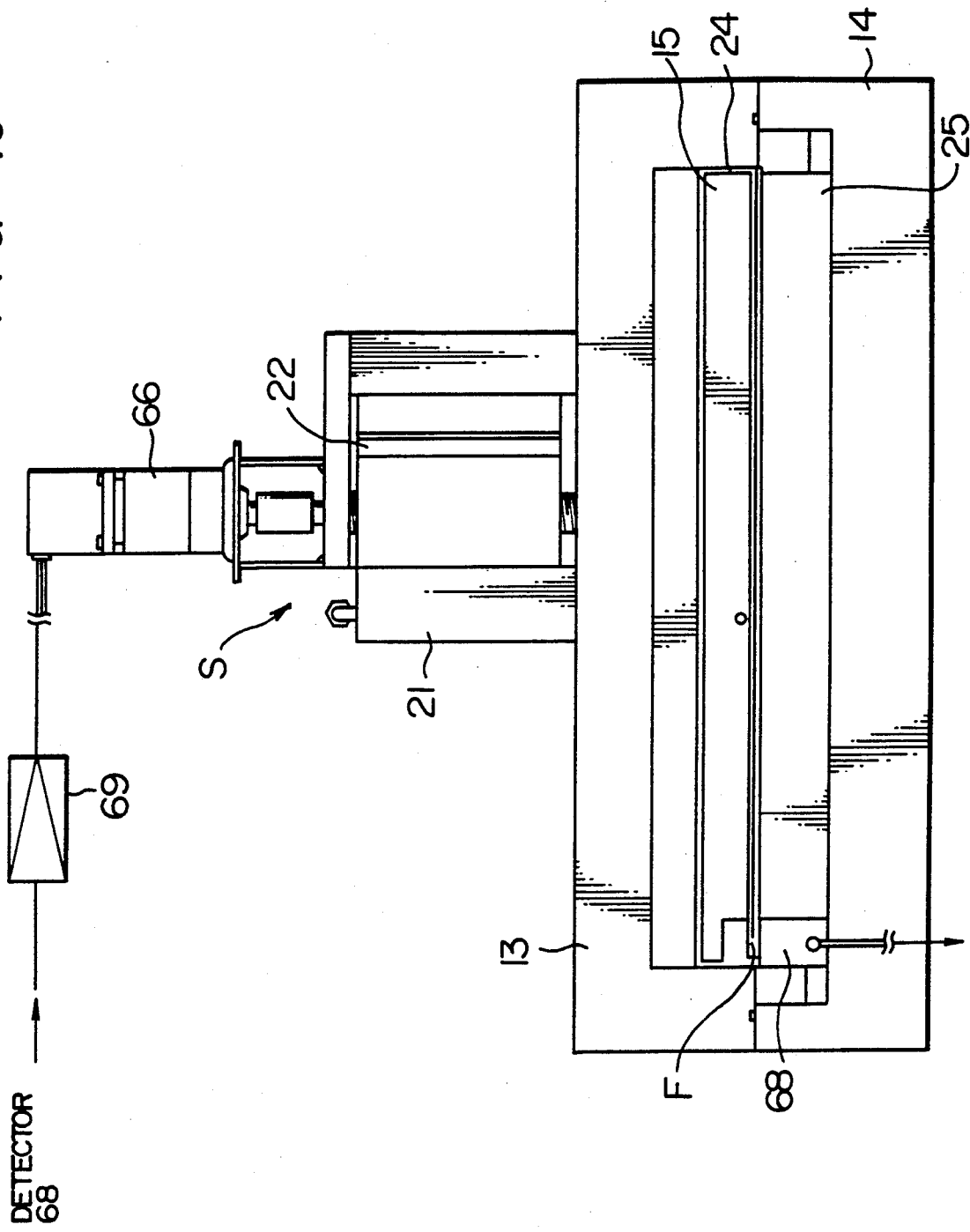
FIG. 19 is a view as seen from the direction indicated by the line XIX—XIX.

FIG. 17 shows another example of a sealing device which constitute the vacuum chambers 2 or 3, FIG. 18 is a section taken along the line XVII—XVII of FIG. 17, and FIG. 19 is a view as seen when looking in the direction indicated by the arrows of XIX. A sealing device is composed of the upper casing 13, the lower casing 14, and the sealing block 15. An object to be processed F is conveyed through a slit formed by the lower casing 14 and the sealing block 15 without coming into contact therewith. The sealing block 15 and the column 21 integrally formed therewith are moved in the vertical direction through a ball screw 67 and the nut 20 by rotating a stepping motor 66. The stepping motor 66 is operated by a pulse signal transmitted thereto from a control device 69 which receives signals from a detector 68 for measuring the thickness of the object to be processed F. The stepping motor 66 has a high resolution, and the angle of the motor can be be controlled in the order of $10^{-1}$ minutes. Thus, the position of the sealing block 15 can be finely and automatically set in accordance with the thickness of the object to be processed such that it does not contact the object to be processed F and that an optimal sealing is provided. For example, if a stepping motor having a step angle of 0.532 degrees and a ball screw having a reach of 6 mm are used, the position of the sealing block can be controlled with an accuracy of $1.2 \times 10^{-6}$ mm/step. In consequence, in a case where an object to be processed F having a thickness of 0.1 mm is conveyed, if the gap between the sealing block 15 and the lower casing 14 is set to 0.3 mm beforehand with the gap between the lower casing 14 and the object to be processed F and the gap between the sealing block 15 and the object to be processed being both at 0.1 mm, the sealing block 15 can be automatically moved with a high degree of accuracy so as to provide a sealing gap of 0.3 mm.

What is claimed is:

1. A continuous vacuum processing apparatus comprising:

a vacuum processing chamber;

at least one preliminary vacuum chamber disposed in advance of said vacuum processing chamber; and at least one post vacuum chamber disposed subsequent to said vacuum processing chamber;

wherein each of said vacuum chambers has a slit-type sealing device through which an object to be processed is passed and which is adapted to seal said vacuum processing chamber from the outside thereof;

wherein a guide member for guiding said object to be processed is provided at each of two sides of each of said sealing devices or at one side thereof in such a manner as to be movable in a direction perpendicular to the direction in which said object to be processed is conveyed in accordance with tension of said object being detected by a tension detecting means;

wherein a slit forming member of each of said sealing devices is made movable in the direction perpendicular to the direction of conveyance of said object to be processed; and wherein each of said sealing devices is comprised of a flat plate-like first member, a second member having a recessed surface which faces said first member, a flat-plat member accommodated in said recessed portion of said second member, said flat-late member having a surface which faces said first member and which forms a slit through which said object to be processed is passed, and means for moving said flat plate member in a direction perpendicular to the direction in which said object to be processed is conveyed.

2. A continuous vacuum processing apparatus comprising:

a vacuum processing chamber;

at least one preliminary vacuum chamber disposed in advance of said vacuum processing chamber;

at least one post vacuum chamber disposed subsequent to said vacuum processing chamber;

wherein each of said vacuum chambers has a slit-type sealing device through which an object to be processed is passed and which is adapted to seal said vacuum processing chamber from the outside thereof;

a guide member disposed at each of two sides of each of said sealing devices or at one side thereof for guiding said object to be processed;

means for detecting the thickness of said object to be processed; and a control device for controlling a slit-like gap of each of said sealing devices using signals from said detecting means.

3. A continuous vacuum processing apparatus according to claim 2, wherein said means for controlling said slit-like gap of said sealing device has a stepping motor for adjusting said slit-like gap.

4. A continuous vacuum processing apparatus comprising:

a vacuum processing chamber;

at least one preliminary vacuum chamber disposed in advance of said vacuum processing chamber;

at least one post vacuum chamber disposed subsequent to said vacuum processing chamber;

wherein each of said vacuum chambers has a slit-type sealing device through which an object to be processed is passed and which is adapted to seal said vacuum processing chamber from the outside thereof;

wherein a guide roller for guiding said object to be processed is provided at each of two sides of each of said sealing devices or at one side thereof;

wherein a slit forming member of said each sealing device is made movable in a direction perpendicular to a direction in which said object to be processed is conveyed so as to enable a gap to be adjusted;

wherein said each sealing device is comprised of a flat plate-like first member, a second member having a recessed surface which faces said first member, a flat-plate member accommodated in said recessed portion of said second member, said flat-plate member having a surface which faces said first member and which forms a slit through which said object to be processed is passed, and means for moving said flat plate member in a direction perpendicular to said direction in which said object to be processed is conveyed;

wherein said roller is made movable in a direction perpendicular to said direction of conveyance of said object to be processed in accordance with a result of processing of tension detecting means; and wherein an air outlet is provided within said slit of said each sealing device.

* * * * *